United States Patent [19]

Nagami

[11] 4,397,000
[45] Aug. 2, 1983

[54] OUTPUT CIRCUIT

[75] Inventor: Akira Nagami, Tokyo, Japan

[73] Assignee: Nippon Electric Co., Ltd., Tokyo, Japan

[21] Appl. No.: 225,600

[22] Filed: Jan. 19, 1981

[30] Foreign Application Priority Data

Jan. 18, 1980 [JP] Japan ................................ 55-4377

[51] Int. Cl.³ .............................................. G11C 7/00
[52] U.S. Cl. ................................... 365/189; 365/190; 365/203; 307/242; 307/575; 307/DIG. 3
[58] Field of Search ....................... 365/189, 190, 203; 307/238.3, 238.8, 242, 573, 575, DIG. 3

Primary Examiner—George G. Stellar
Attorney, Agent, or Firm—Sughrue, Mion, Zinn, Macpeak & Seas

[57] ABSTRACT

An output buffer circuit operable at a high-speed and stably holding output level is disclosed. The output buffer circuit comprises a pair of input transistors receivivable a true and a complementary signals, a pair of output nodes from which amplified signals of the true and complementary signals are derived, a pair of switching gates coupled between the drains of the input transistors and the output nodes and control means for operatively disenabling the switching gates when logic state of the true and complementary signals applied to the input transistors is reversed.

12 Claims, 11 Drawing Figures

PRIOR ART

FIG. 3

PRIOR ART

FIG. 4

PRIOR ART

OUTPUT CIRCUIT

The present invention relates to an output circuit, and more particularly to an output buffer circuit in a dynamic random access memory.

At present, as dynamic memories having a large memory capacity, those of the so-called multi-strobe system are predominantly in use. This system comprises one set of address input terminals, a row address strobe signal terminal, and a column address strobe signal terminal, whereby row address information may be taken in via the address input terminals in synchronism with a row address strobe signal ($\overline{RAS}$), and column address information may be taken in via said address input terminals in synchronism with a column address strobe signal ($\overline{CAS}$). Details of such multi-strobe system are disclosed in U.S. Pat. No. 3,969,706. In such a dynamic RAM, depending upon the mode of energization of the $\overline{RAS}$, $\overline{CAS}$ and a write enable signal (WE), the read-write operations can be controlled in various modes such as, a read-modify-write mode or the like.

However, in every operation mode, an output buffer circuit of a dynamic RAM is required to have the function of stably holding data read out of the memory. Moreover, in such a dynamic RAM, the output buffer circuit and a sense amplifier system are connected through an input/output bus so that the read data may be transmitted to the output buffer circuit through the input/output bus, and after the output data have been established, data to be written may be supplied to the memory through the same input/output bus. Hence, it is necessary to make provision such that the data to be written upon writing may not be influenced by the output state of the output buffer circuit.

It is therefore one object of the present invention to provide an output buffer circuit which can stably hold an output.

Another object of the present invention is to provide an output buffer circuit which can operate at a high speed.

A semiconductor circuit according to the present invention comprises a pair of bus lines transmittable a true and a complementary signals, a pair of input transistors receivable signals transferred from the pair of bus lines, a pair of output nodes from which amplified signals of the true and complementary signals by the pair of input transistors are derived, a pair of switching gates respectively coupled between drains of the input transistors and the output nodes, means for detecting change in logic state of the pair of bus lines and means for disenabling said pair of switching gates in response to an output of the detecting means.

According to the above featured present invention, after amplification of read-out data transferred through the bus lines, such amplified data can be retained stably if write data is applied to the bus line directly after the read-out operation.

According to the present invention, there is provided an output circuit comprising a first data line, a second data line, a first node, a second node, a first series circuit including a first transistor and a second transistor connected in series, a second series circuit including a third transistor and a fourth transistor connected in series, first means for connecting first end of said first series circuit to said first node, second means for connecting first end of the second series circuit to the second node, third means for supplying second ends opposite to the first ends of the first and second series circuit with a first potential, fourth means for connecting the first data line to a gate of said second transistor, fifth means for connecting the second data line to a gate of the fourth transistor, a fifth transistor, a sixth transistor, sixth means for connecting a drain of the fifth transistor to the first data line, seventh means for connecting a drain of the sixth transistor to the second data line, eighth means for connecting a gate of the fifth transistor to the second data line, ninth means for connecting a gate of the sixth transistor to the first data line, tenth means for connecting a source of the fifth transistor to a gate of the first transistor, eleventh means for connecting a source of the sixth transistor to a gate of the third transistor, first precharge means for operatively charging the gate of the first transistor to a second potential and second precharge means for operatively charging the gate of the third transistor to the second potential, the second potential being capable of conducting the first and third transistors.

According to one feature of the present invention, there is provided an output buffer circuit comprising true and complementary input nodes, a first insulated gate field effect transistor having its drain connected to a first node, its gate connected to said true input node and its source connected to a first voltage source, a second insulated gate field effect transistor having its drain connected to a second node, its gate connected to said complementary input node and its source connected to said first voltage source, a third insulated gate field effect transistor having its drain connected to a third node, its gate connected to a fourth node and its source connected to said first node, a fourth insulated gate field effect transistor having its drain connected to a fifth node, its gate connected to a sixth node and its source connected to said second node, first drive means for driving said third node, second drive means for driving said fifth node, a fifth insulated gate field effect transistor having its drain connected to said true input node, its gate connected to said complementary input node and its source connected to a seventh node, a sixth insulated gate field effect transistor having its drain connected to said complementary input node, its gate connected to said true input node and its source connected to an eight node, a seventh insulated gate field effect transistor having its drain connected to said seventh node, its gate connected to a first clock and its source connected to said fourth node, an eight insulated gate field effect transistor having its drain connected to said eight node, its gate connected to said first clock and its source connected to said sixth node, first charging means for bringing said forth node to a high-impedance high-level state, and second charging means for bringing said sixth node to a high-impedance high-level state, whereby a true buffer output may be generated at said fifth node, while a complementary buffer output may be generated at said third node.

According to the present invention, owing to the fact that an input/output bus serves directly as an input without including an intervening node nor a transfer MOST, an output buffer circuit in a 2-clock MOS dynamic RAM that is free from the disadvantages of the prior art circuit can be realized in that the output buffer circuit can operate at a high speed, and that with regard to various conditions imposed to the data output of the multi-address input type MOS dynamic RAM as will be described later, the data output level can be stabilized by electrically assuring the output level without keeping the gate nodes of output push-pull MOST's at a high-impedance condition.

The above-mentioned and other objects, features and advantages of the present invention will become more apparent by reference to the following detailed description of the invention taken in conjunction with the accompanying drawings, wherein.

Throughout the following description, it is assumed that MOS transistors (hereinafter abbreviated as MOST) which are representative ones among the insulated gate field effect transistors are employed, especially they are embodied as N-channel MOST's, and a high level is taken as a logic "1", while a low level is taken as a logic "0". However, it is to be noted that the circuit construction is essentially the same even if P-channel MOST's are employed.

Figure 1:
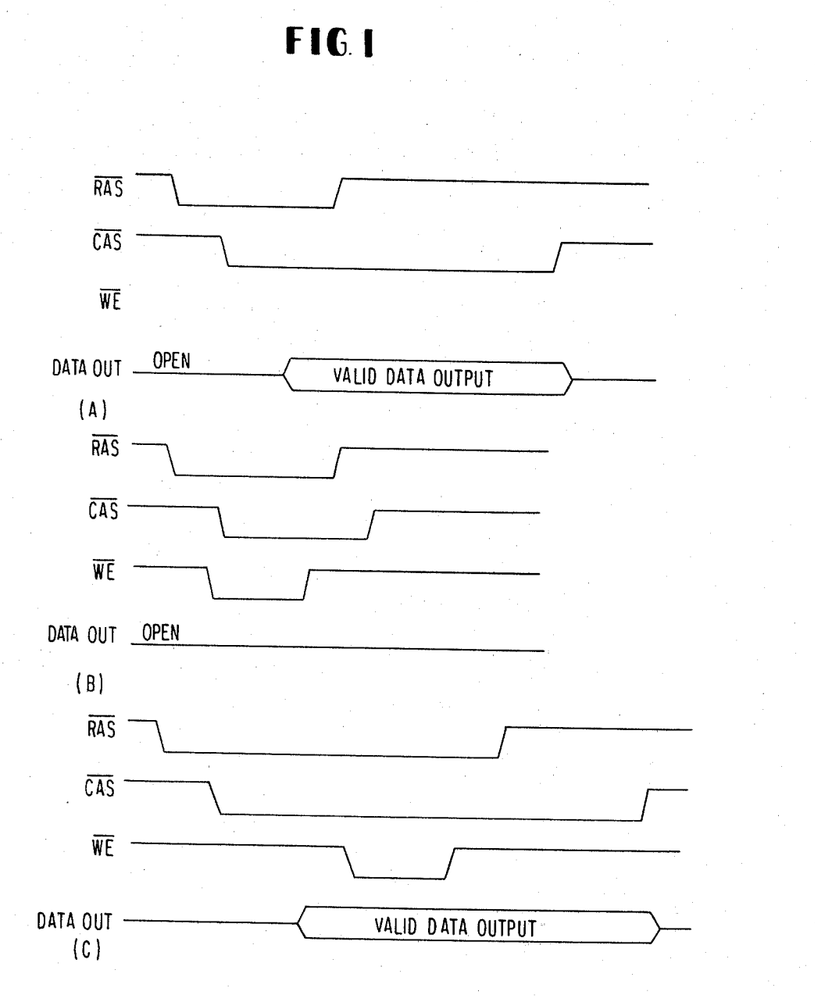
FIGS. 1(A), 1(B) and 1(C) are waveform diagrams representing the conditions required for a data output in a 2-clock MOS dynamic RAM.

Normally, a data output of a multi-address input type MOS dynamic random access memory (RAM) having 2 clocks consisting of a row address strobe signal ($\overline{RAS}$) and a column address strobe signal ($\overline{CAS}$), is imposed with the following conditions as explained with reference to FIG. 1:

(1) As shown in FIG. 1(A), the $\overline{RAS}$ is activated first by changing it to a low level and then the $\overline{CAS}$ is activated to be made low level. After the $\overline{CAS}$ has been activated, during the period when both the RAS and the $\overline{CAS}$ are in an activated state, if the write control clock, that is, the write enable signal $\overline{WE}$ is inactivated, then the period become a read cycle. Read data appear at a data output after an access time has elapsed since the activation of the $\overline{CAS}$, and thus the data output DATA OUT changes from a high-impedance state (open) to an output state of either "1" or "0". The read data are necessitated to be effectively held until the $\overline{CAS}$ is reset. Normally holding a data output for 10 µS is required, but there exists a rating which conditions to hold the data output for an infinite period. Accordingly, in this case, a sufficient holding and back-up function for a data output is necessitated. Especially in the event that the $\overline{RAS}$ is reset earlier than the $\overline{CAS}$, the $\overline{CAS}$ system circuit also enters into a reset precharge state jointly with the $\overline{RAS}$ series circuit. Hence, holding of the data output must be achieved only with the output circuit.

(2) As shown in FIG. 1(B), if the $\overline{WE}$ is in an activated state (low level), then the mode becomes an early write cycle, so that the output is necessitated to be held at a high impedance state (open) throughout that cycle.

(3) As shown in FIG. 1(C), if the $\overline{WE}$ is activated with a sufficient delay after the $\overline{CAS}$ has been activated (low level), then not only read data appear at the output but also a write operation is carried out. If the difference in time between the activations of the $\overline{CAS}$ and the $\overline{WE}$ is smaller than the access time, the period becomes a read-write cycle, whereas if it is larger than the access time, the period becomes a read-modify-write cycle. The data output is similar to the above-referred case (2), hence the output data must be effectively held as they were read out until the $\overline{CAS}$ is reset, and it is necessary to make provision that the write operation may not influence the output state.

In a 2-clock MOS dynamic RAM, as a matter of course, an output buffer circuit is required which satisfies the above-mentioned three conditions and also operates at a high speed.

Figure 2:
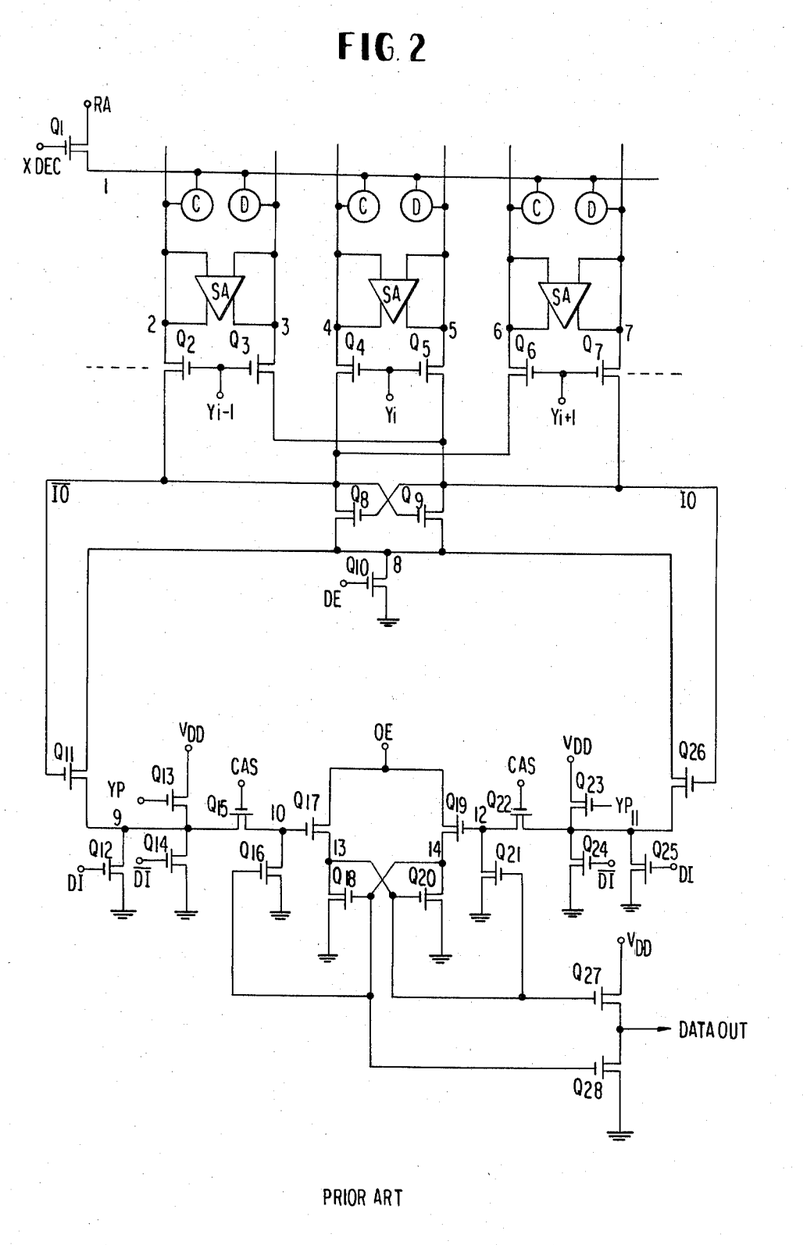
FIG. 2 is a schematic circuit diagram showing a first prior art example of an output buffer circuit in a 2-clock MOS dynamic RAM.

A first example of the heretofore known output buffer circuits is illustrated in FIG. 2. A word line drive clock RA is received via a selected buffer output MOST $Q_1$ of an X-decoder, and in response thereto the level of the selected word line node 1 rises. Informations stored in the memory cells and reference cells (C and D, respectively, in FIG. 2) along the selected word line appear on digit lines 2 to 7, respectively. Subsequently sense amplifiers SA are activated and thereby the informations in the memory cells C and D are refreshed. The operations up to this point are operations based on the activation of the $\overline{RAS}$. In succession to the $\overline{RAS}$, the $\overline{CAS}$ is activated, and assuming that a Y-decoder output $Y_i$ is selected and thus its level rises, then MOST's $Q_4$ and $Q_5$ become conducting, so that the levels at the digit line nodes 4 and 5 after the activation of the sense amplifiers, are respectively transferred to the input/output buses $\overline{IO}$ and IO. Thereafter, a level of an activation timing DE for an input/output bus data amplifier rises, so that a data amplifier consisting of MOST's $Q_8$ to $Q_{10}$ is activated and thereby the levels on the input/output buses IO and $\overline{IO}$ are logically amplified. A node 9 and a node 11 have been precharged by a timing YP. Furthermore, a $\overline{CAS}$ is a clock which rises in level as soon as the CAS is activated (turned to a low level), so that the node 10 and the node 12 have been also precharged at the same potential through the MOST's $Q_{15}$ and $Q_{22}$.

Considering now the case where the bus IO shifts to a high level and the bus $\overline{IO}$ shifts to a low level, since a node 8 is brought to the ground potential by the conduction through the MOST $Q_{10}$, a MOST $Q_{26}$ becomes conducting, hence the precharged electric charge at the node 11 and the node 12 is discharged through the MOST's $Q_{26}$ and $Q_{10}$. The both nodes shift to the ground potential. On the other hand, a MOST $Q_{11}$ is kept non-conducting, and hence the node 9 and the node 10 maintain the precharge potential. Subsequently, when an output buffer activation timing OE is raised in level, since a MOST $Q_{17}$ is conducting while a MOST $Q_{19}$ is non-conducting, a node 13 rises nearly in synchronism with the timing OE, whereas a node 14 is kept at a low level and is brought to the ground potential by conduction through a MOST $Q_{20}$. Accordingly, a MOST $Q_{27}$ becomes conducting while a MOST $Q_{28}$ becomes non-conducting, and a high level output is obtained at the output DATA OUT.

The operations of the output buffer have been described above, and in these operations the above-referred conditions (1) to (3) are fulfilled in the following manner. If the $\overline{RAS}$ is reset earlier than the $\overline{CAS}$, the $\overline{CAS}$ series timing is reset together with the $\overline{RAS}$ series timing. Hence at first the $\overline{CAS}$ shifts to a low level and then the YP rises. Since only the OE is a clock operating synchronously with the $\overline{CAS}$, during this period it is maintained at a high level. Therefore, the MOST's $Q_{15}$ and $Q_{22}$ become non-conducting, thus no change in level occurs at the node 10 and the node 12, and the node 9 and the node 11 transfer to the precharge level. The node 13 and node 14 also make no change in level, and accordingly, the read data remain intact at the data output. The node 13 and node 14 are not at a high-impedance state, but in this case, since the node 10 is at a high-impedance high-level state and the MOST $Q_{17}$ is kept conducting, the node 13 is applied with the timing OE through the MOST $Q_{17}$. Whereas the node 14 is held at the ground potential through the conducting MOST $Q_{20}$. As described above, with regard to holding of a data output, there exists no problem.

In the early write cycle, provision is made such that after activation of the write data inputs DI and $\overline{DI}$ the levels of the input/output buses may not be transmitted to the output buffer. When the CAS is activated and the $\overline{CAS}$ rises, the node 10 and the node 12 transfer to the precharge level and the MOST's $Q_{17}$ and $Q_{19}$ become conducting. At this moment, the timing OE is at the ground potential and the node 13 and the node 14 are maintained at the ground potential. The data output holds a high-impedance state which has been established since the $\overline{CAS}$ was reset. If data to be written are determined before the timing OE is activated and thus either one of the DI and $\overline{DI}$ rises, then the node 9 and node 11 are discharged respectively through the MOST's $Q_{12}$ and $Q_{14}$ and through the MOST's $Q_{24}$ and $Q_{25}$, and the node 10 and node 12 are also discharged through the MOST's $Q_{15}$ and $Q_{22}$, respectively, and thus transfer to the ground potential. The MOST's $Q_{17}$ and $Q_{19}$ become non-donducting, hence even if the OE is activated subsequently, the node 13 and node 14 are held at a low level, resulting in no change in the data output. Therefore, the node 13 and node 14 can be maintained at a high-impedance state throughout the cycle. At the time point when the OE is activated, if the levels corresponding to the read data appear at the node 10 and node 12 through the above-described operations, then output data are produced. Subsequently when the inputs DI and $\overline{DI}$ are activated and the node 10 and node 12 are discharged. Thus, the MOST's $Q_{17}$ and $Q_{19}$ become non-conducting. A higher level one of the node 13 and node 14 is held at a high-impedance state, while a lower level one of them is held at the ground potential through the MOST $Q_{18}$ or $Q_{20}$.

The activated levels of the input DI and $\overline{DI}$ are fed through write gates to the IO and $\overline{IO}$, respectively, and are written in the memory cells via Y-decoder buffers. However, since the node 9 and the node 11 are discharged at the same time, the node 13 and node 14 are completely disconnected from the buses IO and $\overline{IO}$, respectively. Accordingly, write operations can be achieved while read data are maintained at the output, and thus a read-write cycle or a read-modify-write cycle is effected. Whether the early write cycle or the read-write cycle occurs, that is, whether the output is kept at a high-impedance state or read data are produced, depends upon the timing relation between the activation of the OE and the activation of the DI and $\overline{DI}$, and if the DI and $\overline{DI}$ are activated earlier, then the former occurs, while if the OE is activated sufficiently earlier, then the latter occurs. In the circuit arrangement shown in FIG. 2, between the input/output buses IO and $\overline{IO}$ and the buffer outputs at the nodes 13 and 14, respectively, are interposed two level transfer MOST's, that is, MOST's $Q_{11}$ and $Q_{15}$ and MOST's $Q_{26}$ and $Q_{22}$, and therefore, this prior art circuit arrangement has the shortcoming that if delay in operation is caused by these level transfer MOST's, in the read (-modify-)write cycle there is a possibility that the buffer output, that is, the high level at the node 13 or 14 may be lowered in level by a leakage under the high-impedance condition and thereby the output may be influenced.

Figure 3:
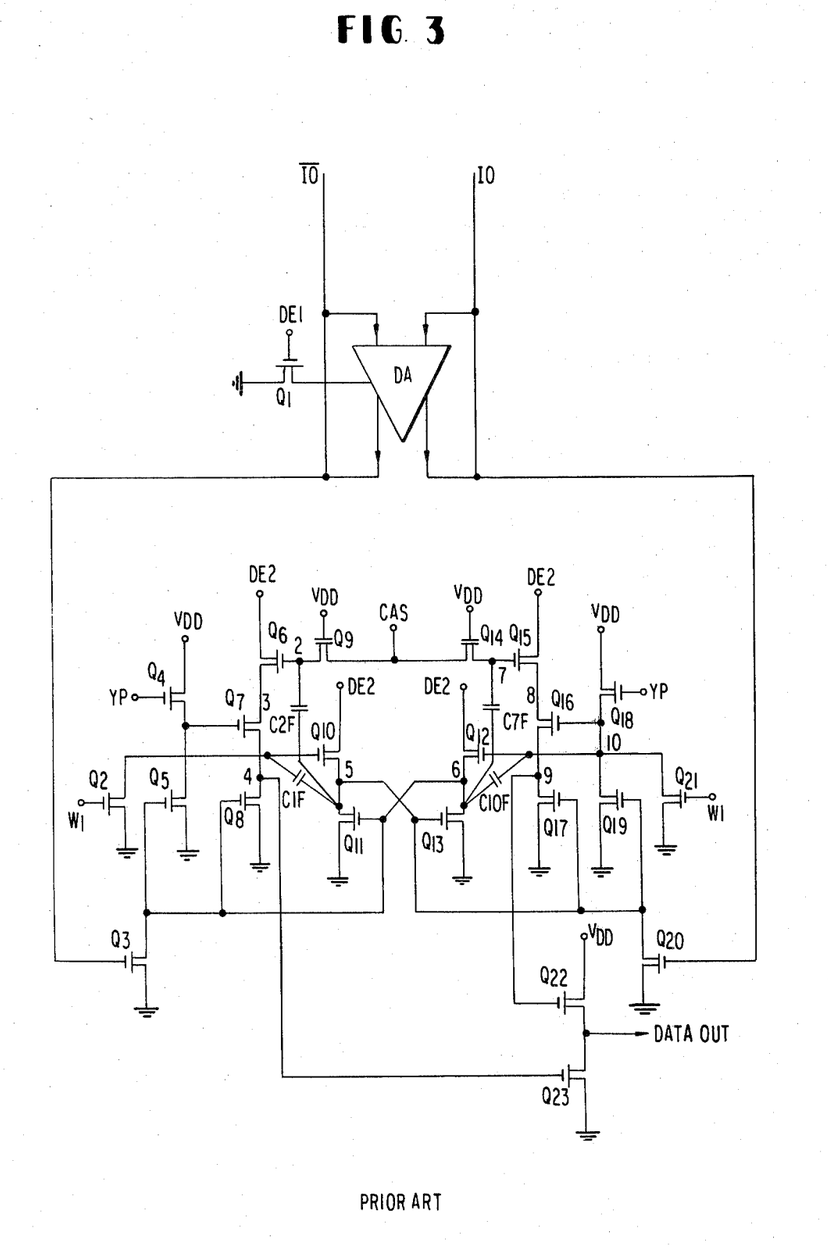
FIG. 3 is a schematic circuit diagram showing a second prior art example of an output buffer circuit in a 2-clock MOS dynamic RAM.

A second example of the heretofore known output buffer circuits is illustrated in FIG. 3. Assuming now that a data amplifier DA has been activated by a signal DE1 and thus a high level and a low level appear on the input/output buses IO and $\overline{IO}$, respectively. Then a MOST $Q_3$ becomes non-conducting while a MOST $Q_{20}$ is conducting. When a signal DE2 is activated in succession to the DE1, both nodes 5 and 6 tend to rise through MOST's $Q_{10}$ and $Q_{12}$, respectively. However, by selecting the current capacity of the MOST $Q_{20}$ sufficiently larger than that of the MOST $Q_{10}$, the node 5 is suppressed to a low level and only the node 6 rises following the DE2. Since a precharged electric charge at a node 1 is discharged through a MOST $Q_5$. Thus MOST's $Q_7$ and $Q_{10}$ become non-conducting and nodes 4 and 5 are brought to the ground potential through the MOST's $Q_8$ and $Q_{11}$, respectively. In response to the rise of the node 6, nodes 7 and 10 are raised sufficiently higher than a level of a voltage source $V_{DD}$ via bootstrap capacitors C7F and C10F, respectively. Since a MOST $Q_{17}$ is non-conducting, MOST's $Q_{15}$ and $Q_{16}$ are driven to an unsaturated region, and hence a node 9 rises following the DE2. As a result, a MOST $Q_{22}$ becomes conducting, while a MOST $Q_{23}$ becomes non-conducting, and thus a high level data output can be obtained.

The operations are as described above. In the case where the $\overline{RAS}$ is reset earlier than the $\overline{CAS}$, at first the CAS transfers to a low level, nodes 2 and 7 are brought to a low level through MOST's $Q_9$ and $Q_{14}$, respectively. Subsequently, a timing YP rises and signals DE1 and DE2 transfer to the ground potential, so that nodes 5 and 6 are brought to the ground potential via MOST's $Q_{10}$ and $Q_{12}$, respectively. Since MOST's $Q_6$, $Q_{15}$, $Q_8$ and $Q_{17}$ become non-conducting, the levels at the nodes 4 and 9 are both held at a high-impedance state, and thereby a read data output can be maintained. In response to activation of the control clock $\overline{WE}$, depending upon the timing relation between the rises of a timing clock W1 and a signal DE2, either an early write cycle in which the output is kept at a high-impedance state or a read(-modify-)-write cycle in which a write operation is effected while read data are produced at the output, is determined. When the W1 rises, nodes 1 and 10 are respectively discharged through MOST's $Q_2$ and $Q_{21}$ and thus brought to the ground potential, and hence MOST's $Q_7$, $Q_{10}$, $Q_{12}$ and $Q_{16}$ become non-conducting. Accordingly, at this time point the levels at the nodes 4 and 9 are held under a high-impedance state, and the output is also held intact. In the case where the rise of the W1 occurs earlier than that of the DE2, the nodes 4 and 9 are held at the ground potential equally to the DE2 via the MOST's $Q_6$ and $Q_7$ and via the MOST's $Q_{15}$ and $Q_{16}$, respectively, and are kept intact under a high-impedance state. Hence, the output is held at a high-impedance state throughout the operation cycle. If the W1 rises after the DE2 has been activated and read data have appeared at the output, then at the nodes 4 and 9 the levels upon reading are kept intact under a high-impedance state and the level at the output upon reading is kept intact under a high-impedance state, and thus the read data at the output can be maintained.

As described above, the shortcoming of the circuit arrangement shown in FIG. 3 is that in all the above-referred three cases (1) to (3), at the nodes 4 and 9 the levels are maintained under a high-impedance state. Hence, there is a possibility that the output may be influenced by a leakage or a noise. It is also an additional shortcoming of this circuit arrangement that since the charging of the nodes 4 and 9 is effected through two serially connected MOST's $Q_6$ and $Q_7$, and $Q_{15}$ and $Q_{16}$, respectively, in order to obtain an equal rise speed to that in the case of a single MOST, a current capacity about twice as large as that in the latter case is necessitated for each MOST.

Figure 4:
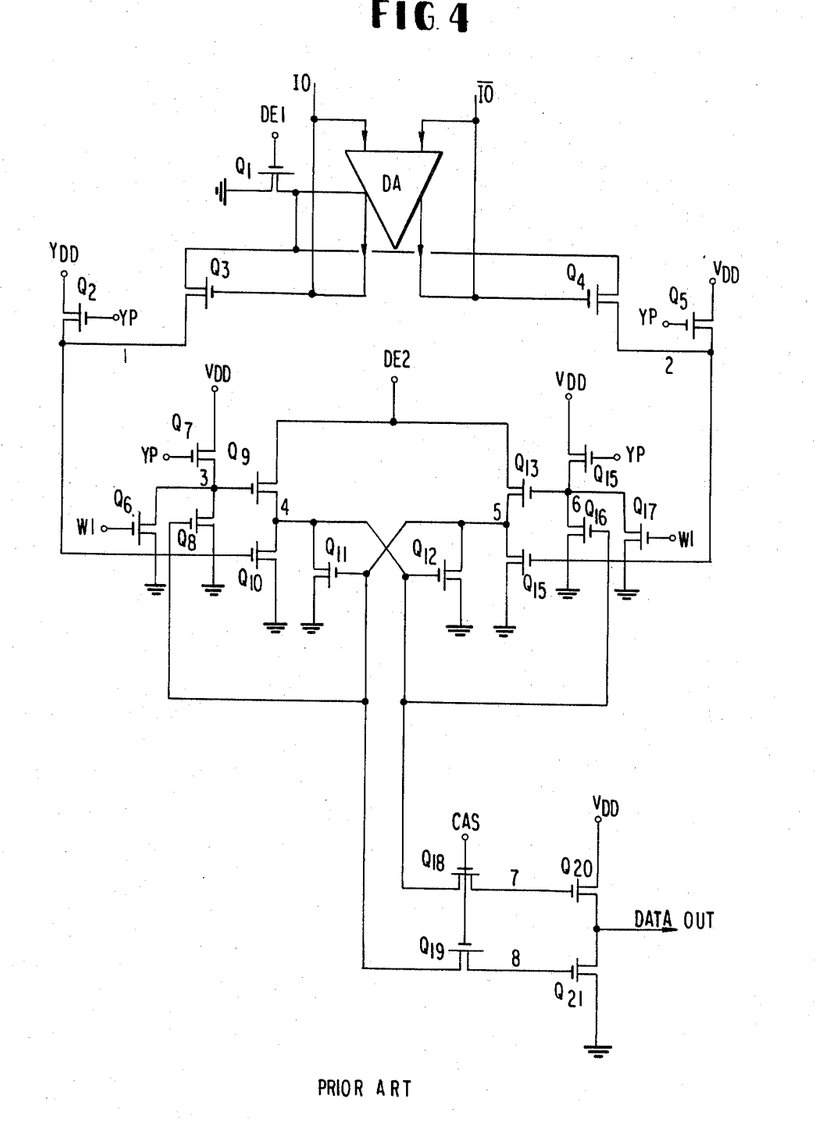
FIG. 4 is a schematic circuit diagram showing a third prior art example of an output buffer circuit in a 2-clock MOS dynamic RAM.

A third example of the heretofore known output buffer circuits is illustrated in FIG. 4. When a data amplifier DA is activated by a signal DE1 and a high level and a low level appear on the input/output buses IO and $\overline{\text{IO}}$, a MOST $Q_3$ becomes conducting while a MOST $Q_4$ becomes non-conducting, so that a node 1 is discharged through MOST's $Q_1$ and $Q_3$ and brought to the ground potential. On the other hand, a node 2 is held at the precharged level. Subsequently, when a signal DE2 rises, both nodes 4 and 5 tend to follow the potential rise via MOST's $Q_9$ and $Q_{13}$. However, by selecting a current capacity of a MOST $Q_{14}$ sufficiently larger than that of a MOST $Q_{13}$, the node 5 is suppressed to a low level, and only the node 4 rises following the DE2. A node 6 is discharged through a MOST $Q_{16}$, so that the MOST $Q_{13}$ becomes non-conducting and the node 5 settles at the ground potential. The level changes at the nodes 4 and 5 are transferred to nodes 7 and 8, respectively, via MOST's $Q_{18}$ and $Q_{19}$ and thereby a high-level data output can be obtained.

The read operations are as described above, and in the case that the $\overline{\text{RAS}}$ is reset earlier than the $\overline{\text{CAS}}$, at first the CAS transfers to a low level, so that the MOST's $Q_{18}$ and $Q_{19}$ become non-conducting, and the levels at the nodes 7 and 8 are in themselves held under a high-impedance state. Subsequently, when a timing YP rises and signals DE1 and DE2 shift to the ground potential, the nodes 4 and 5 are reset at the ground potential. In other words, the buffer output is separated into a reset state and a level holding state by means of the MOST's $Q_{18}$ and $Q_{19}$, and thereby a read data output is maintained. Similarly to the circuit arrangement shown in FIG. 3, depending upon the timing relation between the rises of the W1 and the DE2, discrimination between the early write cycle and the read(-modify)-write cycle is effected. If the W1 rises earlier than the DE2, then the nodes 3 and 6 are discharged through MOST's $Q_6$ and $Q_{17}$, respectively, so that the MOST's $Q_9$ and $Q_{13}$ become non-conducting, and at the nodes 4 and 5 are held the levels upon resetting at a high-impedance state. The nodes 7 and 8 take similar states, and thus the output is maintained at a high impedance state throughout the operation cycle. Whereas, if the W1 rises after the DE2 has risen and read data have appeared at the output, then the nodes 4 and 5 transfer to a high-impedance state while keeping their levels intact. The nodes 7 and 8 also behave in a similar manner, and thus the read data can be maintained at the output.

In the case of writing opposite data to the read data through the input/output buses IO and $\overline{\text{IO}}$, both the nodes 1 and 2 are brought to the ground potential, so that the MOST's $Q_{10}$ and $Q_{14}$ both become non-conducting, and therefore, the data being written would not influence the levels at the nodes 4 and 5, respectively. The circuit arrangement shown in FIG. 4 has the shortcoming that a delay would arise in the response of the data output due to the facts that the input/output buses IO and $\overline{\text{IO}}$ do not directly coupled to the output buffer but the nodes 1 and 2 intervene therebetween, and that the transfer MOST's $Q_{18}$ and $Q_{19}$ are interposed at the output nodes of the output buffer. In addition, it is also another shortcoming of this circuit arrangement as described previously that in all the above-referred cases (1) and (3) the nodes 7 and 8 are held at a high-impedance state.

Figure 5:
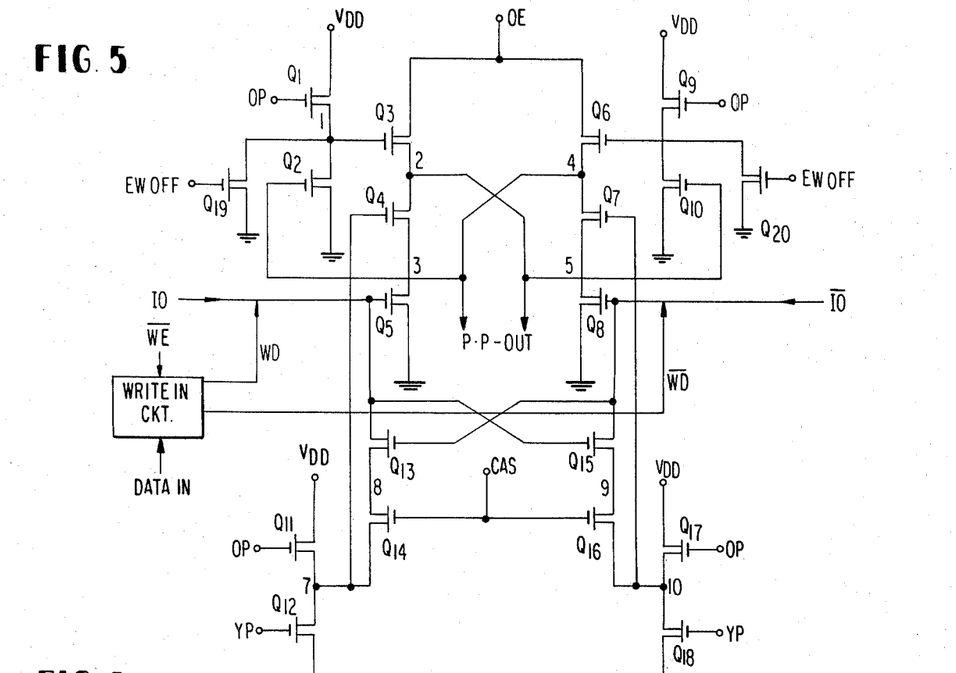
FIG. 5 is a schematic circuit diagram showing a basic construction of an output buffer circuit according to the present invention.
Figure 6:
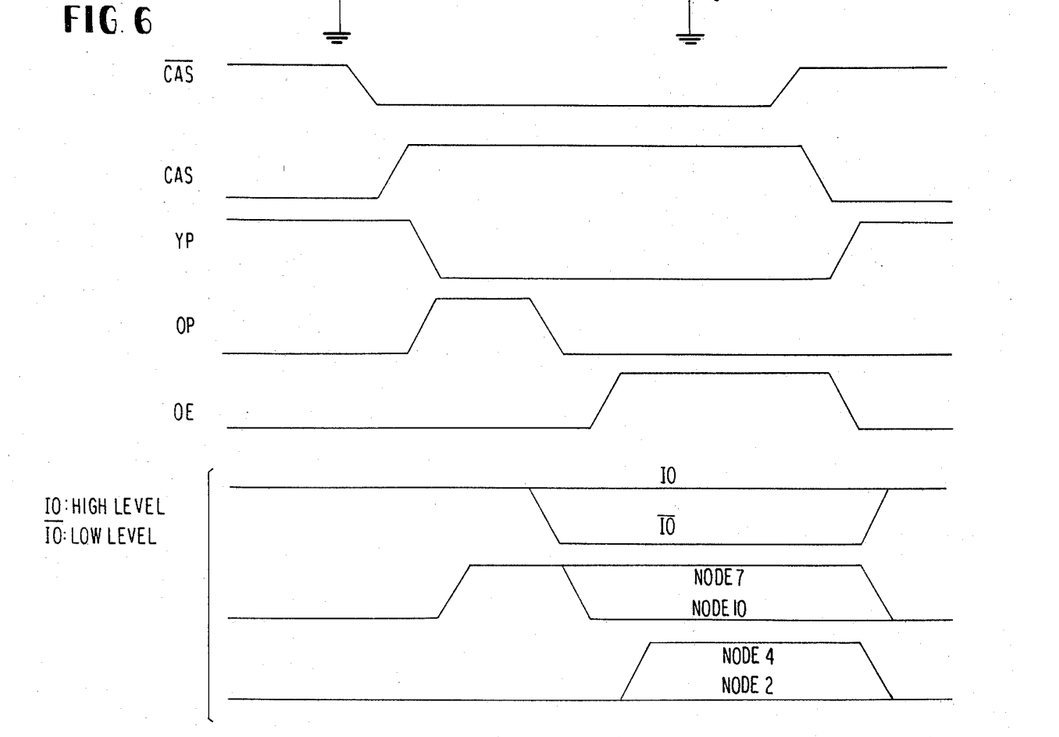
FIG. 6 is a waveform diagram showing waveforms of clock timing signals and signals appearing at principal nodes in FIG. 5, FIGS. 7 to 9 are more detailed circuit diagrams showing a practical embodiment of the present invention.

A basic circuit construction of the output buffer circuit according to the present invention is illustrated in FIG. 5, and clock timing waveforms and operation waveforms at principal nodes in the circuit shown in FIG. 5 are illustrated in FIG. 6.

When the external clock $\overline{\text{CAS}}$ changes from a high level to a low level and is thus activated, at first the CAS rises and then a timing OP rises following the CAS. Although nodes 1, 6, 7 and 10 are charged, the OP shifts to a low level simultaneously with or prior to activation of a data amplifier (not shown), and hence upon activation of the output buffer these nodes take a high-impedance high-level state. When the data amplifier is activated and the input/output bus IO takes a high level while the input/output bus $\overline{\text{IO}}$ takes a low level, a MOST $Q_{13}$ becomes non-conducting while a MOST $Q_{15}$ is conducting. Both MOST's $Q_{14}$ and $Q_{16}$ are conducting because their gates are connected to CAS in common, and the node 10 is discharged through MOST's $Q_{15}$ and $Q_{16}$ following the change of the bus $\overline{\text{IO}}$ to a low level. On the other hand, at the node 7 the charged level is held under a high impedance state, because the MOST $Q_{13}$ becomes non-conducting. Accordingly, in response to the change of the bus $\overline{\text{IO}}$ to a low level while the bus IO is kept at a high level, a MOST $Q_8$ becomes non-conducting and immediately thereafter a MOST $Q_7$ becomes non-conducting, while MOST's $Q_4$ and $Q_5$ are kept conducting. Thereafter, when a timing OE is activated to a high level, nodes 2 and 4 tend to follow the OE through MOST's $Q_3$ and $Q_6$, respectively. However, by selecting the current capacities of the serially connected MOST's $Q_4$ and $Q_5$ sufficiently larger than that of the MOST $Q_3$, the node 2 is suppressed to a low level. Only the node 4 rises following the OE, hence, the node 1 is discharged through a MOST $Q_2$. Therefore, the MOST $Q_3$ becomes non-conducting and thus the node 2 takes the ground potential. The levels at the nodes 2 and 4 are received by push-pull circuit (P.P-OUT) such as one structured by MOST's $Q_{27}$ and $Q_{28}$ of FIG. 2 (not shown) to provide a high-level data output.

The operations of the above-described output buffer circuit according to the present invention in the above-referred three cases (1) to (3), are as follows. In the case that the $\overline{\text{RAS}}$ is reset earlier than the $\overline{\text{CAS}}$, at first the $\overline{\text{CAS}}$ changes to a low level and then the timing YP rises. The timing OE is such timing that it may be produced in synchronism with the $\overline{\text{CAS}}$ independently of the RAS similarly to the heretofore known circuit arrangement in FIG. 2. In response to the rise of the YP, both the nodes 7 and 10 take the ground potential, and hence the MOST's $Q_4$ and $Q_7$ become non-conducting. With regard to the levels at the nodes 1 and 6, a high level is kept intact under a high-impedance state while a low level is maintained at the ground potential, and at the nodes 2 and 4, the read data levels would remain as supported by the MOST's $Q_3$ and $Q_6$. The condition for the data output in the early write cycle or the read(-modify)-write cycle can be fulfilled merely by discharging the nodes 1 and 6 through MOST's $Q_{19}$ and $Q_{20}$ by employing a timing EWOFF which can be activated only in the early write cycle. In the early write cycle, the EWOFF rises earlier than the OE, so that the MOST's $Q_3$ and $Q_6$ become non-conducting and the nodes 2 and 4 take a low level under a high-impedance state. Although this operation is similar to that in the heretofore known circuit arrangement, the nodes 2 and 4 can be held at the ground potential by means of the EWOFF. In the read-modify-write cycle, the EWOFF is kept at a low level, and in response to activation of the OE, the read data levels appear at the nodes 2 and 4. Assuming now that the input/output buses IO and $\overline{IO}$ are respectively at a high level and at a low level. Thereafter the opposite data are to be written, then the bus IO changes from a high level to a low level, while the bus $\overline{IO}$ changes from a low level to a high level due to a true write data WD and complement write data $\overline{WD}$ derived from a write-in circuit WRITE IN CKT connected to the buses IO and $\overline{IO}$. Consequently, the MOST $Q_{15}$ changes from a conducting state to a non-conducting state, so that the node 10 which has been held at the ground potential as connected to the bus IO through the MOST's $Q_{15}$ and $Q_{16}$, changes to a high-impedance state while maintaining its level intact. On the other hand, the MOST $Q_{13}$ changes from a non-conducting state to a conducting state, so that an electric charge maintained at the node 7 under a high-impedance state is discharged towards the bus IO through the MOST's $Q_{13}$ and $Q_{14}$, and thus the node 7 is brought to the ground potential. Accordingly, the MOST $Q_4$ also becomes non-conducting while the MOST $Q_7$ is kept non-conducting. Hence, the read data levels are held intact at the nodes 2 and 4, respectively. Since the EWOFF does not rise, at the nodes 1 and 6 are maintained the levels upon reading, and the levels at the nodes 2 and 4 are supported by the MOST's $Q_3$ and $Q_6$, respectively.

In the output buffer circuit in FIG. 5, the input/output buses IO and $\overline{IO}$ serve directly as inputs to the output buffer circuit without any intervening nodes therebetween nor without including any transfer MOST, and therefore, the circuit can operate at a high speed. Since the charging of the nodes 2 and 4 also can be achieved through a single MOST of the MOST's $Q_3$ and $Q_6$, the charging capacity can be selected large. In the above-referred three cases (1) to (3), the levels at the nodes 2 and 4 which determine the data output, can be always maintained stably not under a high-impedance state. More particularly, in the case where the $\overline{RAS}$ is reset earlier than the $\overline{CAS}$, the read data output in the read(-modify)-write cycle can be held at the levels of the nodes 2 and 4, respectively, through the MOST's $Q_3$ and $Q_6$. Therefore, it becomes stable. In the early write cycle, the nodes 2 and 4 are held at the ground potential by the EWOFF, and hence, the output is at a high-impedance state.

Figure 7:
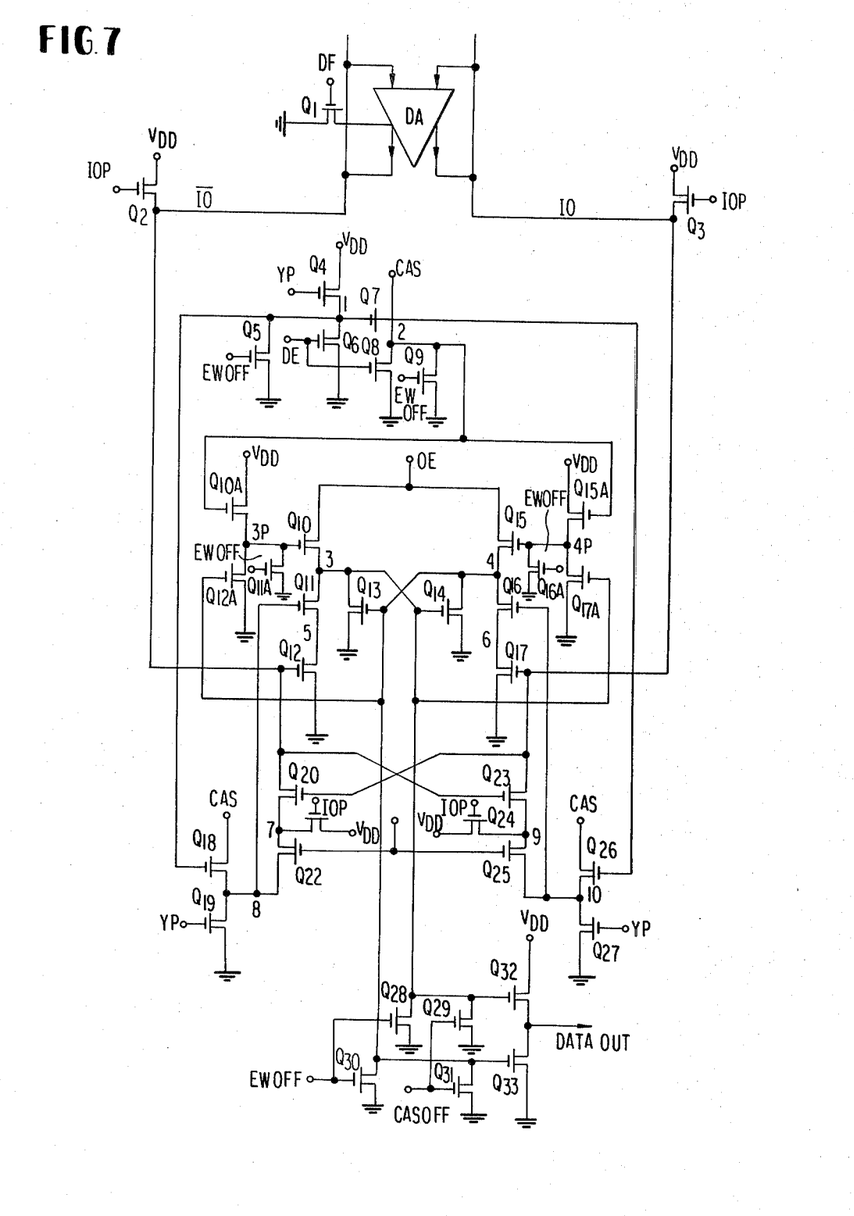
Figure 8:
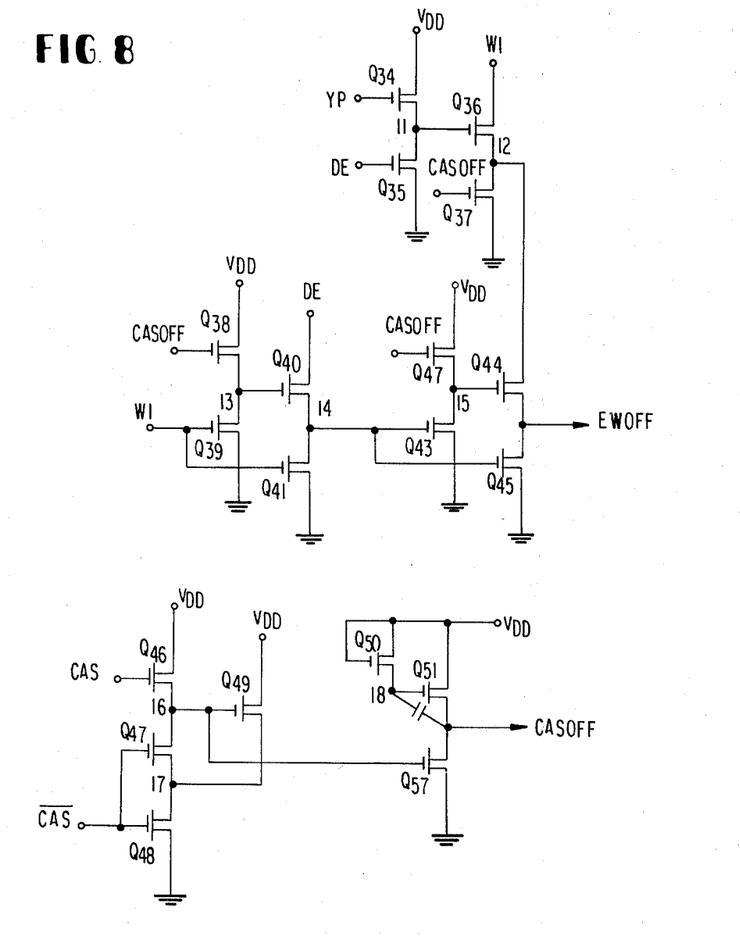
Figure 9:
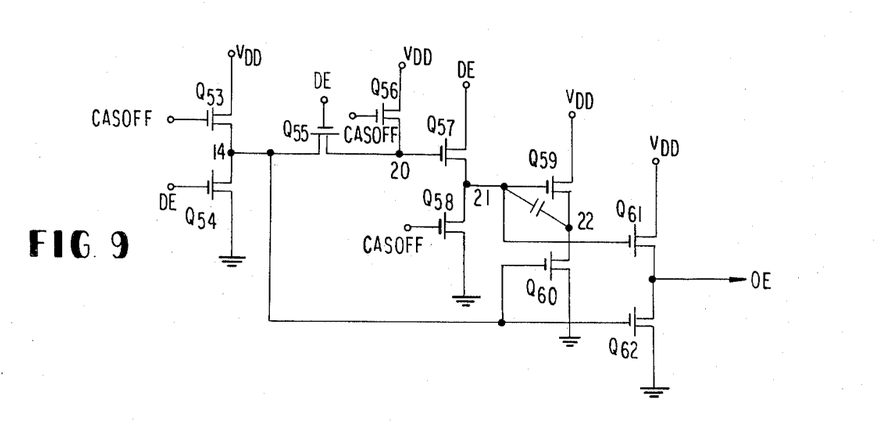

A practical embodiment of the present invention is illustrated in FIGS. 7 to 9. The circuit arrangement shown in FIG. 7 is a practical embodiment of the basic circuit according to the present invention illustrated in FIG. 5, FIG. 8 illustrates a generator circuit of a timing signal EWOFF which is activated only in the early write cycle and a generator circuit of another timing signal CASOFF which brings the output DATA OUT into a high-impedance state during the period when the $\overline{CAS}$ is at a high level, i.e., inactivated. FIG. 9 illustrates a generator circuit of an output buffer activation timing signal OE which is synchronized with the $\overline{CAS}$ as isolated from the $\overline{RAS}$, and which maintains a high level even if the $\overline{RAS}$ is reset earlier than the $\overline{CAS}$, and transfers to a low level after the $\overline{CAS}$ has been reset. When the $\overline{CAS}$ changes to a low level and it enters an activated period, at first the CAS rises, then nodes 2, 8 and 10 rise following the CAS. Thus precharge operations in the output buffer circuit are effected. If the DE is raised after read data from a selected memory cell have appeared on the data input/output buses IO and $\overline{IO}$, then a data amplifier DA is activated, and while one of the buses IO and $\overline{IO}$ is held at the precharged level which was produced by a timing signal IOP, the other bus transfers to the ground potential. At the same time, the node 1 is discharged and brought to the ground potential, and the nodes 2, 8 and 10 take the precharged level under a high impedance state. Considering now the case that the IO is at a high level and the $\overline{IO}$ is at a low level, a MOST $Q_{20}$ becomes conducting, and hence, the node 8 is immediately discharged through the MOST's $Q_{20}$ and $Q_{22}$ and transfers to the ground potential. On the other hand, a MOST $Q_{23}$ becomes non-conducting, and the level at the node 10 is maintained intact.

When the OE rises in response to the rise of the DE in the circuit shown in FIG. 9, nodes 3 and 4 both tend to follow the rise of the OE through MOST's $Q_{10}$ and $Q_{15}$, respectively. However, since MOST's $Q_{16}$ and $Q_{17}$ are conducting, the node 4 can be maintained at a low level by selecting the current capacities of these two serially connected MOST's $Q_{16}$ and $Q_{17}$ sufficiently larger than the current capacity of the MOST $Q_{15}$. Since MOST's $Q_{11}$ and $Q_{12}$ are non-conducting, the node 3 rises following the OE, whereas the node 4 is brought to the ground potential through MOST's $Q_{14}$ and $Q_{17A}$. In this way, a high-level read data output can be obtained at the output DATA OUT.

Thereafter, if the $\overline{RAS}$ is reset earlier than the CAS, in the circuit shown in FIG. 7 at first the $\overline{CAS}$ transfers to a low level, MOST's $Q_{22}$ and $Q_{25}$ become non-conducting and thereby the bus IO is isolated from the node 10 and the bus $\overline{IO}$ is isolated from the node 8. Subsequently, a timing signal YP rises, hence the nodes 8 and 10 transfer to the ground potential. MOST's $Q_{11}$ and $Q_{16}$ become non-conducting, and thus the levels at the nodes 3 and 4 are isolated from the buses IO and $\overline{IO}$, respectively, and remain intact. The levels at nodes 3P and 4P are also maintained intact, the levels at the nodes 3 and 4 are supported by the MOST's $Q_{10}$ and $Q_{15}$, respectively, and thereby the read data output can be held stably.

In the early write cycle, a write timing signal W1 rises well in advance of the rise of the OE. Accordingly, in the circuit shown in FIG. 8 a node 14 is brought to the ground potential, and MOST's $Q_{43}$ and $Q_{45}$ become non-conducting. And in response to the signal W1 the timing signal EWOFF is raised through MOST's $Q_{36}$ and $Q_{44}$. In the circuit shown in FIG. 7 the nodes 1, 2, 3P and 4P are discharged, hence all the precharged electric charges in the output buffer are discharged, and the nodes 3 and 4 are also brought to the ground potential via MOST's $Q_{28}$ and $Q_{30}$. Even though the timing signal OE rises later, the nodes 3 and 4 are not influenced thereby because the MOST's $Q_{10}$ and $Q_{15}$ are non-conducting. Accordingly the output takes a high-impedance state, and thus state can be maintained stably throughout the cycle, because the timing signal EWOFF is held at a high level until the $\overline{CAS}$ is reset.

In the read(-modify)-write cycle, the timing signal W1 rises later than the timing signal OE, so that in the circuit shown in FIG. 8 a MOST $Q_{36}$ becomes non-conducting, and a node 12 does not rise. Therefore, the timing signal EWOFF is held at a low level. In FIG. 7 after read data have been produced at the output, new data to be written come to the input/output buses IO and $\overline{IO}$. Considering now the case where after high level read data have appeared with the bus IO brought to a high level and the bus $\overline{IO}$ brought to a low level, writing of opposite data is effected, the bus IO changes from a high level to a low level, while the bus $\overline{IO}$ changes from a low level to a high level. The MOST $Q_{20}$ transfers from a conducting state to a non-conducting state. Therefore, the node 8 takes a low level under a high-impedance state. On the other hand, the MOST $Q_{23}$ transfers from a non-conducting state to a conducting state, so that the electric charge at the node 10 is discharged towards the bus IO through the MOST's $Q_{23}$ and $Q_{25}$, and thereby the node 10 is brought to the ground potential. Accordingly, both the MOST's $Q_{11}$ and $Q_{16}$ become non-conducting and the levels at the node 3 and node 4 are retained intact. The levels at the node 3P and node 4P also do not change, hence the levels at the node 3 and node 4, respectively, are supported by the MOST's $Q_{10}$ and $Q_{15}$, and thereby the read data output can be maintained stably.

As described in detail above, according to the present invention there is provided a novel output buffer circuit, which can operate at a high speed and can be stabilized with respect to maintenance of an output state in the read cycle, in the early write cycle and in the read(-modify)-write cycle by electrically assuring the levels at the levels at the gate nodes of output stage push-pull MOST's not under a high impedance state, owing to the facts that there is no intervening node between the input/output buses and the output buffer circuit but the input/output buses are received directly by the output buffer circuit and that a transfer MOST is not necessitated, and this novel improved output buffer circuit is effective for improving the performance of a 2-clock system MOS dynamic RAM.

I claim:

1. An output circuit comprising a first data line, a second data line, a first node, a second node, a first series circuit including a first field-effect transistor and a second field-effect transistor connected in series, a second series circuit including a third field-effect transistor and a fourth field-effect transistor connected in series, first means for connecting first end of said first series circuit to said first node, second means for connecting first end of said second series circuit to said second node, third means for supplying second ends opposite of said first ends of said first and second series circuit with a first potential, fourth means for connecting said first data line to a gate of said second transistor, fifth means for connecting said second data line to a gate of said fourth transistor, a fifth field-effect transistor, a sixth field-effect transistor, sixth means for connecting a drain of said fifth transistor to said first data line, seventh means for connecting a drain of said sixth transistor to said second data line, eighth means for connecting a gate of said fifth transistor to said second data line, ninth means for connecting a gate of said sixth transistor to said first data line, tenth means for connecting a source of said fifth transistor to a gate of said first transistor, eleventh means for connecting a source of said sixth transistor to a gate of said third transistor, first precharge means for operatively charging said gate of said first transistor to a second potential, and second precharge means for operatively charging said gate of said third transistor to said second potential, said second potential being capable of conducting said first and third transistors.

2. The circuit according to claim 1, further comprising a push-pull circuit receiving a pair of signals derived from said first and said second nodes.

3. The circuit according to claim 1, in which said tenth means includes a seventh field-effect transistor coupled between the gate of said first transistor and the source of said fifth transistor and said eleventh means includes an eighth field-effect transistor coupled between the gate of said third transistor and the source of said sixth transistor.

4. The circuit according to claim 3, further comprising a ninth field-effect transistor having a source coupled to said first node, a tenth field-effect transistor having a source coupled to said second node, and means supplying drains of said ninth and tenth transistors with a control signal.

5. The circuit according to claim 4, further comprising first control means responsive to a level of said second node for selectively making said ninth transistor non-conducting and second control means responsive to a level of said first node for selectively making said tenth transistor non-conducting.

6. A semiconductor circuit comprising a pair of bus lines transmittable a true and a complementary signals, a pair of input transistors receivable signals transferred from said pair of bus lines, a pair of output nodes from which amplified signals of said true and complementary signals by said pair of input transistors are derived, a pair of switching gates respectively coupled between said input transistors and said output nodes, means for detecting change in logic state of said pair of bus lines and means for disenabling said pair of switching gates in response to an output of said detecting means.

7. The circuit according to claim 6, in which the change in logic state of said pair of bus lines is caused by read-modify-write cycle in a dynamic memory.

8. A memory system comprising a circuit as claimed in claim 6, a plurality of sense amplifiers and a plurality of memory cells.

9. A circuit comprising a first input/output bus line, a second input/output bus line, first switching means having an input terminal supplied with a signal transferred from said first bus line, second switching means having an input terminal supplied with a signal transferred from said second bus line, a first output line, a second output line, third switching means for connecting said first output line to said first switching means, fourth switching means for connecting said second output line to said second switching means, first control means responsive to a first logic state of signals at said first and second bus lines for disenabling one of said third and fourth switching means, and second control means responsive to a change from said first logic state to a second opposite logic state of signals at said first and second bus lines for disenabling the other of said third and fourth switching means.

10. The circuit according to claim 9, further comprising precharge means for charging input terminals of said third and fourth switching means with a potential capable of enabling said third and fourth switching means.

11. The circuit according to claim 10, in which said one of said third and fourth switching means is that connected to disenabled one of said first and second switching means by the signals from said bus lines.

12. A semiconductor circuit comprising true and complementary input nodes; first to eighth nodes; a first insulated gate field effect transistor having its drain connected to said first node, its gate connected to said true input node and its source connected to a first voltage source; a second insulated gate field effect transistor having its drain connected to said second node, its gate connected to said complementary input node and its source connected to said first voltage source; a third insulated gate field effect transistor having its drain connected to said third node, its gate connected to said fourth node and its source connected to said first node; a fourth insulated gate field effect transistor having its drain connected to said fifth node, its gate connected to said sixth node and its source connected to said second node; first drive means for driving said third node; second drive means for driving said fifth node; a fifth insulated gate field effect transistor having its drain connected to said true input node, its gate connected to said complementary input node and its source connected to said seventh node; a sixth insulated gate field effect transistor having its drain connected to said complementary input node, its gate connected to said true input node and its source connected to said eithth node; a seventh insulated gate field effect transistor having its drain connected to said seventh node, its gate connected to a first control signal and its source connected to said fourth node; an eighth insulated gate field effect transistor having its drain connected to said eighth node, its gate connected to said first clock and its source connected to said sixth node; first charging means for bringing said fourth node to a high-impedance high-level state; and second charging means for bringing said sixth node to a high-impedance high-level state; whereby a true buffer output may be generated at said fifth node, while a complementary buffer output may be generated at said third node.

* * * * *

UNITED STATES PATENT AND TRADEMARK OFFICE
CERTIFICATE OF CORRECTION

PATENT NO. : 4,397,000
DATED : August 2, 1983                    Page 1 of 2
INVENTOR(S) : Akira Nagami It is certified that error appears in the above-identified patent and that said Letters Patent is hereby corrected as shown below:

Title Page:

ABSTRACT:

Line 4, change "vivable" to --vable--.

Column 3, line 46, change "RAS" to --$\overline{RAS}$--.

Column 4, line 41, change "$\overline{CAS}$" to --CAS--.

line 42, change "CAS to --$\overline{CAS}$--.

Column 5, line 2, change "$\overline{CAS}$" to --CAS-- line 22, change "CAS" to --$\overline{CAS}$-- line 23, change "$\overline{CAS}$" to --CAS-- line 37, change "donducting" to --conducting--.

UNITED STATES PATENT AND TRADEMARK OFFICE
CERTIFICATE OF CORRECTION

PATENT NO.  : 4,397,000
DATED       : August 2, 1983
INVENTOR(S) : Akira Nagami

It is certified that error appears in the above-identified patent and that said Letters Patent is hereby corrected as shown below:

Column 8, line 16, change "and" to --to-- line 63, change "$\overline{CAS}$" to --CAS-- line 66, change "RAS" to --$\overline{RAS}$--.

Column 9, line 31, change "IO" to --$\overline{IO}$--.

Column 10, line 46, change "CAS" to --$\overline{CAS}$-- line 47, change "$\overline{CAS}$" to --CAS--.

Column 14, line 11, change "eithth" to --eighth--.

Signed and Sealed this

Sixteenth Day of April 1985

[SEAL]

Attest:

DONALD J. QUIGG

Attesting Officer     Acting Commissioner of Patents and Trademarks